(12) United States Patent
Burd et al.

(10) Patent No.: US 10,877,470 B2
(45) Date of Patent: Dec. 29, 2020

(54) INTEGRATED DIGITAL TWIN FOR AN INDUSTRIAL FACILITY

(71) Applicant: HONEYWELL INTERNATIONAL INC., Morris Plains, NJ (US)

(72) Inventors: Matthew G. Burd, Calgary (CA); Paul F. McLaughlin, Ambler, PA (US)

(73) Assignee: Honeywell International Inc., Charlotte, NC (US)

( * ) Notice: Subject to any disclaimer, the term of this patent is extended or adjusted under 35 U.S.C. 154(b) by 423 days.

(21) Appl. No.: 15/416,569

(22) Filed: Jan. 26, 2017

(65) Prior Publication Data

US 2018/0210436 A1    Jul. 26, 2018

(51) Int. Cl.
G05B 23/02      (2006.01)
G05B 19/418     (2006.01)
G06F 30/20      (2020.01)

(52) U.S. Cl.
CPC ... *G05B 23/0243* (2013.01); *G05B 19/41885* (2013.01); *G06F 30/20* (2020.01); *G05B 2219/23005* (2013.01); *Y02P 90/02* (2015.11)

(58) Field of Classification Search
CPC .......... G05B 23/0243; G05B 19/41885; G05B 2219/23005; G06F 17/5009; Y02P 90/26; Y02P 90/18
See application file for complete search history.

(56) References Cited

U.S. PATENT DOCUMENTS

| 6,088,630 A * | 7/2000 | Cawlfield | B01D 3/4255 202/160 |
| 6,155,840 A | 12/2000 | Sallette | |
| 8,060,862 B2 * | 11/2011 | Eldridge | G05B 15/02 700/86 |

(Continued)

FOREIGN PATENT DOCUMENTS

| WO | WO-2016054605 A2 * | 4/2016 | ............ G06F 21/57 |
| WO | 2016116507 A1 | 7/2016 | |

OTHER PUBLICATIONS

M. Ometto et. al., Towards smarter steel manufacturing, May/Jun. 2016, www.steeltimesint.com, pp. 34-37 (Year: 2016).*

(Continued)

*Primary Examiner* — Kamini S Shah
*Assistant Examiner* — Russ Guill (57) ABSTRACT

A method of process monitoring of an industrial process involving a tangible run an industrial facility includes providing an integrated facility digital twin (DT) implemented by a computer system which implements an aggregation algorithm that utilizes models including a plurality of inter-related static models for the industrial facility including an asset model that describes devices and systems in the industrial facility including sensors coupled to processing equipment and a flowsheet model, and dynamic models of the industrial facility including calculation models, symptom and fault models, dynamic simulation models, and machine learning models. The aggregation algorithm using (Continued)

outputs from the static models and dynamic model, generates an aggregated view including performance alerts for at least one of the process equipment and industrial process based on a current performance of the industrial process.

12 Claims, 5 Drawing Sheets

(56) References Cited

U.S. PATENT DOCUMENTS

| | | | | |
|---|---|---|---|---|
| 8,774,948 | B2* | 7/2014 | Xu | G06F 17/5004 |
| | | | | 700/28 |
| 9,354,776 | B1* | 5/2016 | Subramanian | G06F 3/0486 |
| 9,442,475 | B2* | 9/2016 | Subramanian | G06F 30/20 |
| 9,709,978 | B2* | 7/2017 | Asenjo | G05B 19/4185 |
| 9,811,251 | B2* | 11/2017 | Kling | G06F 3/04842 |
| 9,995,278 | B2* | 6/2018 | Lund | F03D 7/047 |
| 10,127,334 | B2* | 11/2018 | Khan | G06F 17/5009 |
| 2003/0147351 | A1* | 8/2003 | Greenlee | G05B 17/02 |
| | | | | 370/232 |
| 2007/0168057 | A1* | 7/2007 | Blevins | G05B 13/022 |
| | | | | 700/53 |
| 2008/0027704 | A1* | 1/2008 | Kephart | G05B 19/41885 |
| | | | | 703/22 |
| 2009/0119077 | A1* | 5/2009 | Norman | G05B 13/026 |
| | | | | 703/6 |
| 2010/0257464 | A1* | 10/2010 | Renner | G06Q 10/10 |
| | | | | 715/757 |
| 2010/0262900 | A1 | 10/2010 | Romatier et al. | |
| 2011/0264415 | A1 | 10/2011 | Bleackley et al. | |
| 2014/0135947 | A1* | 5/2014 | Friman | G05B 23/0267 |
| | | | | 700/29 |
| 2015/0019191 | A1 | 1/2015 | Maturana et al. | |
| 2015/0106067 | A1* | 4/2015 | Boys | G06F 30/20 |
| | | | | 703/2 |
| 2016/0188769 | A1* | 6/2016 | Aylott | G06Q 10/0633 |
| | | | | 703/6 |
| 2016/0247129 | A1 | 8/2016 | Song et al. | |
| 2016/0364510 | A1* | 12/2016 | Kashiwa | G05B 17/02 |
| 2017/0091791 | A1* | 3/2017 | Srinivasan | G06Q 30/0202 |
| 2017/0227954 | A1* | 8/2017 | Seki | G05B 23/0243 |
| 2018/0081344 | A1* | 3/2018 | Romatier | G08B 21/187 |
| 2019/0024002 | A1* | 1/2019 | Bak | C10G 2/30 |

OTHER PUBLICATIONS

Gentaro Fukano et al., "Mirror Plant on-line plant simulator and its applications," 2013, Yokogawa Technical Report English Edition vol. 56 No. 1, 4 pages (Year: 2013).*

Aspen Technology, "New Release of aspenONE® Software Enables Process Engineers to Display Real-Time Data on Simulation Flowsheets . . . ," 2012, https://www.aspentech.com/en/resources/press-releases/new-release-of-aspenonert-software-enables-process-engineers-to-display-real-time-dat1503286067, 4 pages (Year: 2012).*

Li, Bao-Hong, et al., "Aspen Model of the CCPP," 12th International Symposium on Process Systems Engineering and 25th European Symposium on Computer Aided Process Engineering Part A—Computer Aided Chemical Engineering, Mar. 7, 2015, pp. 211-213, Elsevier B.V., Copenhagen, Denmark.

* cited by examiner

INTEGRATED DIGITAL TWIN FOR AN INDUSTRIAL FACILITY

FIELD

Disclosed embodiments relate to digital twins for industrial applications.

BACKGROUND

The Industrial Internet of Things (IIoT) involves implementing data storage, configuration, computing, and/or analytics in the cloud to improve performance, efficiency, profitability and reliability of physical plants, processing equipment and processes. A typical IIoT solution involves collecting data from one or more data sources, modeling an asset (e.g., processing equipment) or a process to monitor or optimize the equipment or the process, and developing analytics to describe and predict equipment behavior or process behavior.

An emerging concept is the 'digital twin' (DT) where a digital model copy of a physical item (e.g., a real machine) is created that supports data access, command and control, remote configuration, as well as simulation and analytics. A DT is commonly created simultaneously with the real devices and systems, such as processing equipment and sensors in the facility. Once created by a specific vendor for their own specific equipment, the DT can be used to represent the machine in a digital representation of a real world system. The DT is created such that it is identical in form and behavior of the corresponding machine.

DTs are supported by the vendors' own IIoT infrastructure. Thus each DT is associated with one and only one machine. A customer deploying IIoT may thus end up having many such DTs deployed on a wide variety of infrastructures because IIoT vendors generally host their solutions on a variety of different cloud platforms (e.g. Microsoft AZURE, Amazon CLOUD, their own or third party data center), and may use a wide variety of open source and other components to create their digital twin solutions.

SUMMARY

This Summary is provided to introduce a brief selection of disclosed concepts in a simplified form that are further described below in the Detailed Description including the drawings provided. This Summary is not intended to limit the claimed subject matter's scope.

Conventional DTs are for only one specific piece of processing equipment. It is recognized to provide a DT for an industrial facility having interconnected processing equipment a plurality of different DTs is thus needed from the different equipment vendors for the various processing equipment deployed on a wide variety of infrastructures. This is recognized to be difficult to manage, and to be inherently less secure than a single integrated digital twin solution for the industrial facility from a trusted vendor. Less security from conventional DT arrangements results because each DT vendor may implement security differently. With a plurality of DT implementations there is a greater chance that one DT may have vulnerabilities, it is harder to thoroughly validate and test security across so a plurality of DT solutions, and configuration and setup for the plurality of DTs will be more complex potentially leading to errors.

Moreover, conventional DTs from individual processing equipment vendors only have access to information about their own processing equipment and not the upstream or downstream environmental and process conditions surrounding that equipment as well as the surrounding equipment. As a result there are limits to the effectiveness of predictive monitoring and other solutions that can be implemented by a conventional DT arrangement in a facility that comprises a conventional plurality of DTs.

A missing piece of the DT landscape is thus recognized to be a framework for creating an integrated DT referred to herein as a facility DT which models the systems and devices including processing equipment and sensors throughout an entire facility at a given location/site, or models an enterprise being the systems and devices at a plurality of geographically separated facilities/sites. Disclosed facility digital twins provide an aggregated view providing performance alerts for at least one of the process equipment and industrial process based on a current performance of the industrial process, such as shown in the FIG. 3 example aggregated view described below.

DETAILED DESCRIPTION

Disclosed embodiments are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring certain aspects. This Disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

A disclosed facility DT is a framework for monitoring an entire industrial facility or a plurality of industrial facilities (an enterprise). The facility DT can be IOT-based. An IOT-based example hosts the facility DT software on a cloud software platform such as Microsoft's AZURE. The facility DT can also be embodied with on-site computing and thus not be dependent on the "cloud" if an on-site DT arrangement is a customer's preference.

To generate a disclosed facility DT, measurement data is provided from each of the processing equipment, measurement devices and control devices to indicate flows, temperature, pressures, state and other conditions throughout the process. A process flow model is also provided which defines how material and utility flows traverse various processing equipment in the industrial process, a dynamic simulation of the process, and a model of the control logic in the facility.

Regarding connectivity, the facility DT has secure connectivity to multiple devices and/or systems at one or more sites. Typically the data may be available at in site process historians in the form of time-series measurements and alarms/events. In other cases the equipment involved may be distributed across geographic areas or interfaced to a variety of systems, involving multiple connections to access the data. An IIoT architecture is appropriate for transmitting that data securely to a centralized DT that can be cloud-based or deployed at a computer system in an enterprise data center at one of the facility sites.

Figure 1:
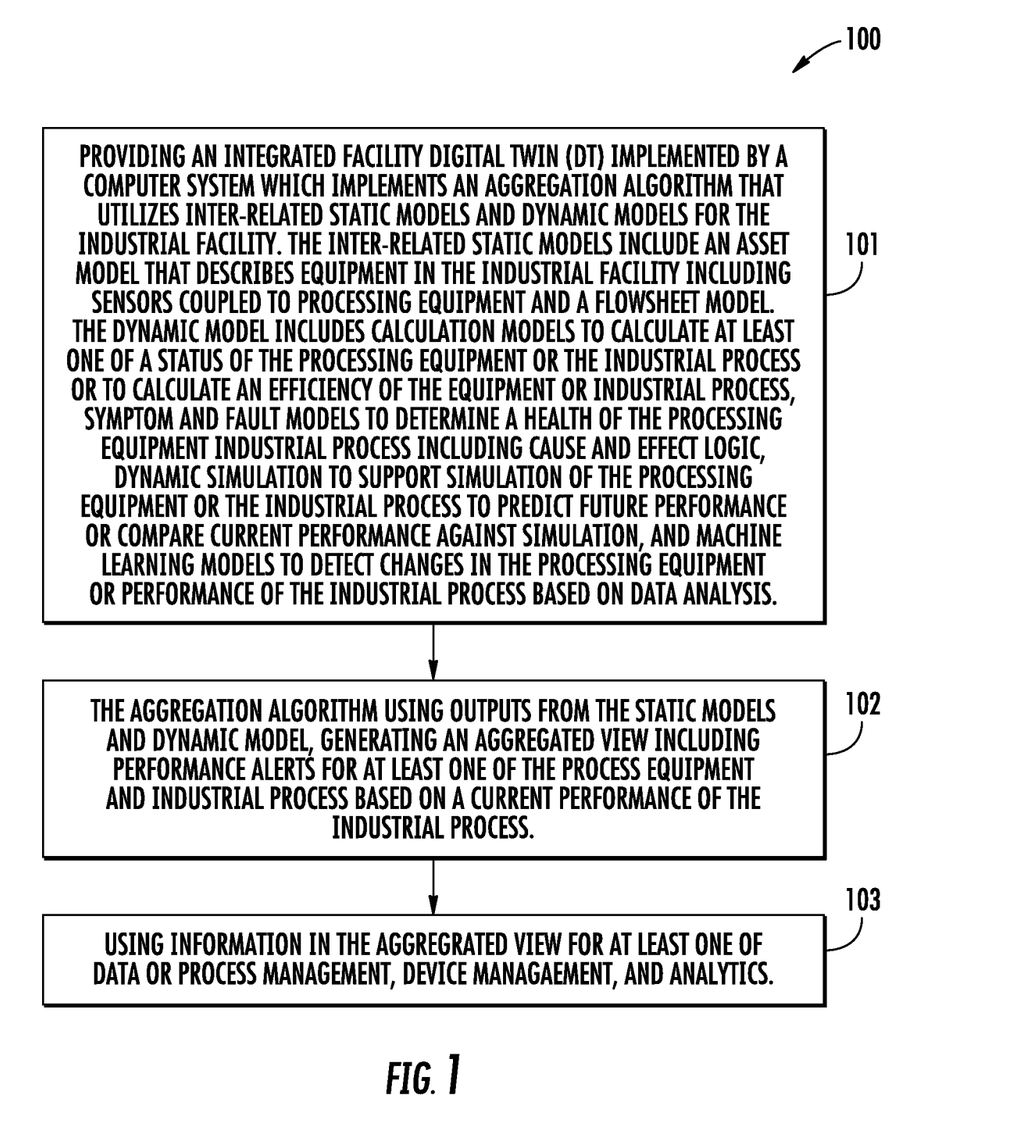
FIG. 1 is a flow chart showing steps for an example method of process monitoring of an industrial process involving a tangible material run at an industrial facility using a facility DT, according to an example embodiment.

FIG. 1 is a flow chart showing steps for an example method 100 of process monitoring of an industrial process involving a tangible material run at an industrial facility using a disclosed facility DT, which produces a finished, tangible product. Disclosed embodiments apply to an industrial process involving a tangible material. Such industrial processes are distinct from a data processing system which only performs data manipulations.

Step 101 comprises providing an integrated facility DT implemented by a computer system including a processor and non-transitory memory running software stored in the memory which implements an aggregation algorithm that utilizes inter-related static models and dynamic models for the industrial facility. The inter-related static models include an asset model that describes devices and systems in the industrial facility including sensors coupled to processing equipment and a flowsheet model. The dynamic model includes calculation models to calculate at least one of a status of the processing equipment or the industrial process or to calculate an efficiency of the equipment or industrial process, symptom and fault models to determine a health of the processing equipment industrial process including cause and effect logic, dynamic simulation (generally based on first-principles models) to support simulation of the processing equipment or the industrial process to predict future performance or compare current (e.g., real-time) performance against simulation, and machine learning models to detect changes in the processing equipment or performance of the industrial process based on data analysis.

Step 102 comprises the aggregation algorithm using outputs from the static models and dynamic model, generating an aggregated view including performance alerts for at least one of process equipment and industrial process based on the current performance of industrial process. Step 103 comprises using information in the aggregated view for at least one of data management, process management (e.g., recommending a change to the facility operating conditions and targets), device management (e.g., recommending equipment maintenance) and analytics (e.g., identifying key contributors to off-normal production).

Figure 2A:
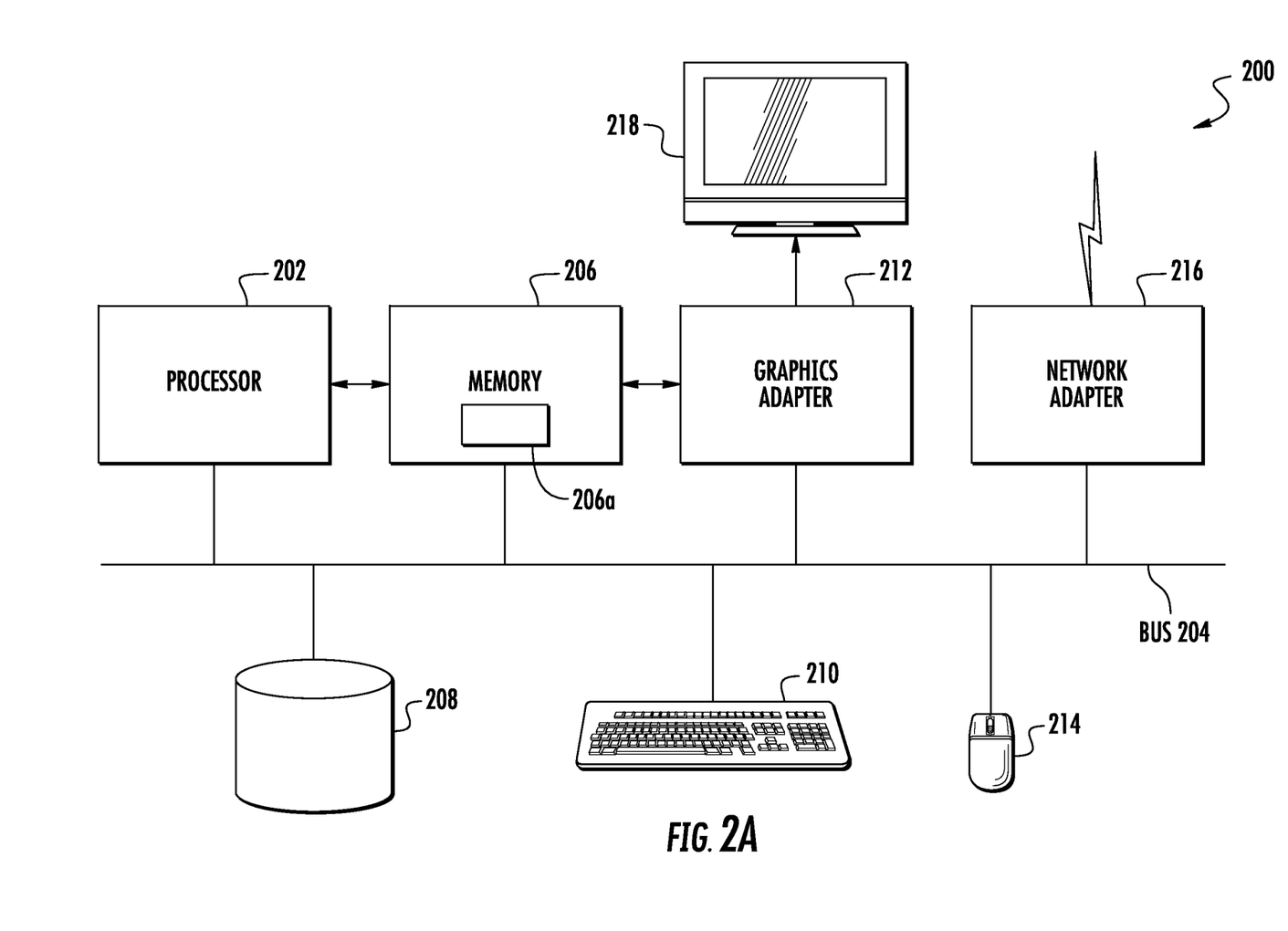
FIG. 2A is a high-level block diagram showing a computer system having a disclosed aggregation algorithm implementing a disclosed facility DT for an on-site DT arrangement.

FIG. 2A is a high-level block diagram showing a computer system 200 having a disclosed aggregation algorithm 206a implementing a disclosed facility DT for an on-site DT arrangement. The computer system 200 is shown including a processor 202 (e.g., a microprocessor, digital signal processor (DSP), or a microcontroller unit (MCU) coupled to a data bus 204. Coupled to the bus 204 are also a memory 206, a storage device 208, a keyboard 210, a graphics adapter 212, a pointing device 214 and a network adapter 216. A display device 218 is coupled to the graphics adapter 212.

The storage device 208 may generally be any device capable of holding large amounts of data, such as a hard drive, compact disk read-only memory (CD-ROM), DVD, or removable storage device. The memory 206 holds instructions and data used by the processor 202 including a disclosed aggregation algorithm 206a. The pointing device 214 may be a mouse, track ball, light pen, touch-sensitive display, or other type of pointing device and is used in combination with the keyboard 210 to input data into the computer system 200. The graphics adapter 212 displays images and other information on the display 218. The network adapter 216 couples the computer system 200 to the network, which may comprise a wired or wireless connection. As noted above, the computer system 200 implementing the facility DT can be IOT-based, such as the facility DT software hosted on a portable cloud software stack in a data center.

Figure 2B:
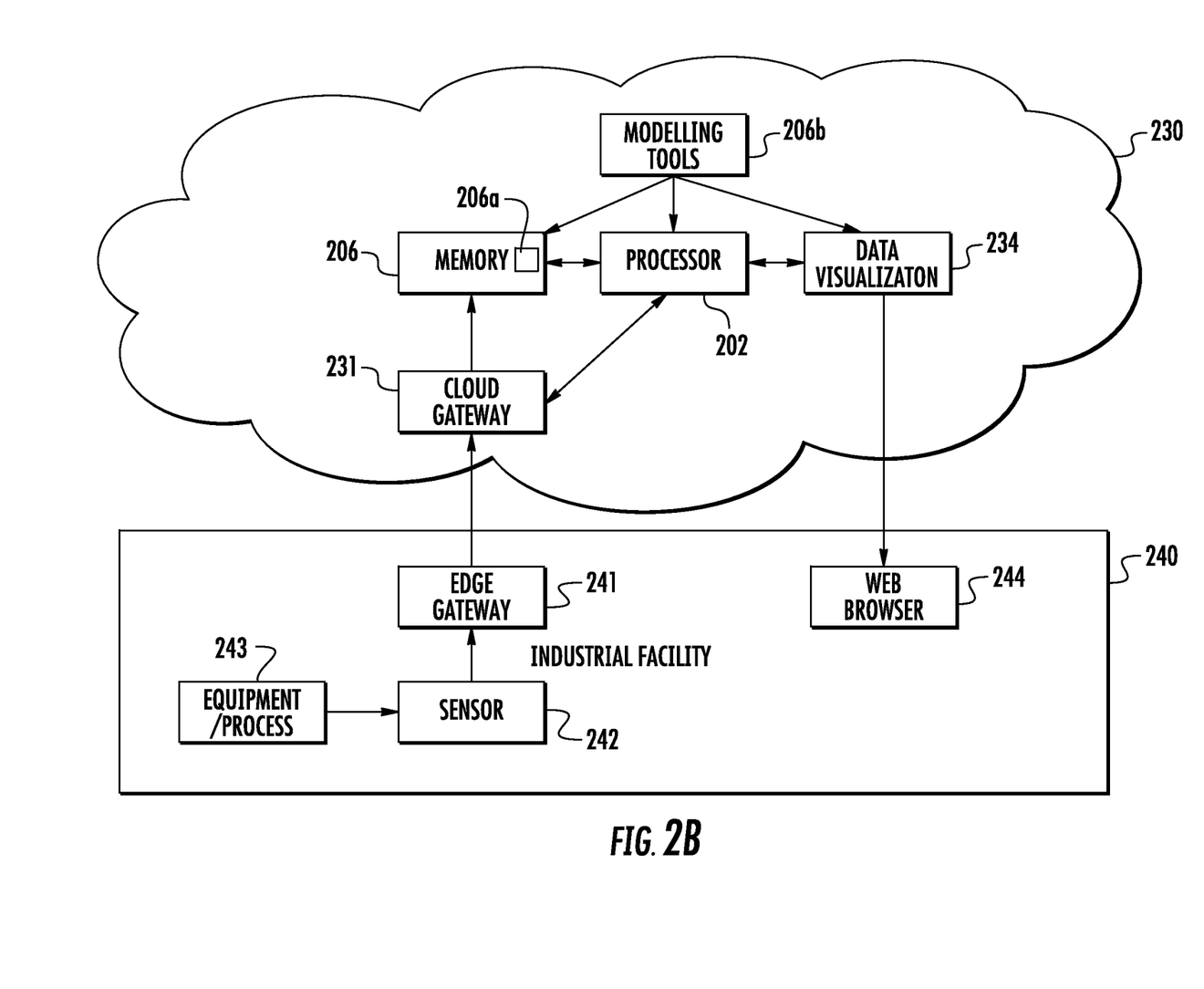
FIG. 2B is a high-level block diagram showing a cloud computing architecture having a disclosed aggregation algorithm stored in memory for implementing a disclosed cloud-based facility DT that is coupled to an industrial facility.

FIG. 2B is a high-level block diagram showing a cloud computing architecture 230 having a disclosed aggregation algorithm 206a stored in memory 206 for implementing a disclosed cloud-based facility DT that is coupled to an industrial facility 240. Modeling tools 206b are also stored in the memory 206. The cloud computing architecture 230 includes a cloud gateway device 231 that communicates with an edge gateway device 241 in the industrial facility 240. The edge gateway device 241 is coupled to receive sensing signals from sensor 242 that senses parameters from equipment/process 243. Processor 202 running aggregation algorithm 206a and modeling tools 206b generates a data visualization 234 that is provided to a web browser 244 in the industrial facility 240.

Figure 2C:
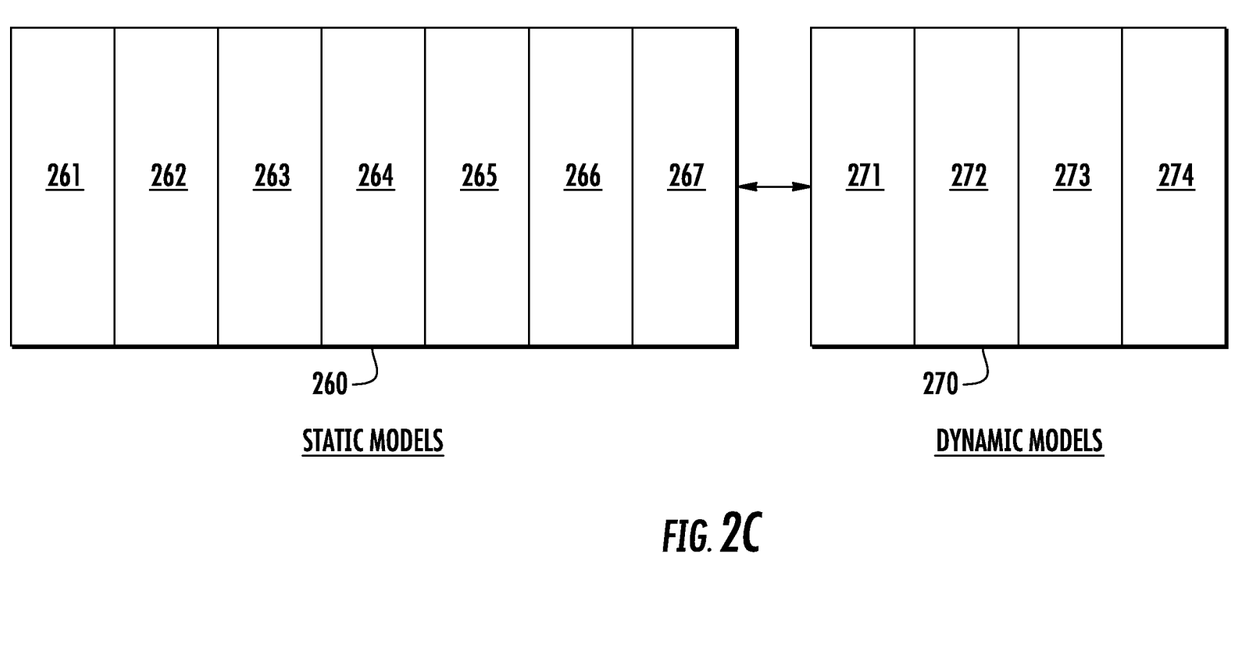
FIG. 2C shows functional blocks for a disclosed facility DT.

FIG. 2C shows various functional blocks for a disclosed facility DT that although described as being implemented by software, may also generally be implemented by hardware. The blocks are thus generally software programs stored on the storage device 208, loaded into the memory 206, and executed by the processor 202. As described above, the functional blocks implementing a disclosed aggregation algorithm 206a include inter-related static models 260 and dynamic models 270 for the industrial facility.

The inter-related static models 260 include an asset model 261 (or plant model) that describes devices and systems in the industrial facility including the processing equipment and sensors coupled to processing equipment. Static models 260 can include optional models including a security model 262 that describes roles and user permissions relative to the industrial facility, a control model 263 that describes control schemes implemented in basic and advanced control systems/applications, a flowsheet model 264 that describes the process flow through the plant, a system model 265 that describes the physical sensors, controllers, networks and computers that operate the plant, an organization model 266 that describes the human organization and related job roles, and a spatial model 267 that describes the devices and systems or process in geographic or geometric terms.

Job roles as used herein means positions in the industrial facility, such as the Site President, Plant Manager, Operations Manager, Control Engineer, etc. This can be used when designing user interactions or workflows for example when a specific event occurs it might be needed to notify the Plant Manager. The organization model can be used to identify who is filling that role so they are notified. Job roles are distinct, though often aligned with security roles which define which users can do what from a system perspective. Information is also provided regarding the interrelationships and organization of the various static models.

Dynamic models 270 can be added, but are often build on the static models listed above. For example a calculation model 271 can calculate additional properties of an asset (often based on other measured properties of that asset) and an optional symptom/fault models 272 can describe potential abnormal conditions of assets. The calculation models 271 are for calculating at least one of a status of the devices and systems or the industrial process, or to calculate an efficiency of the processing equipment or the industrial process, and the symptom and fault models 272 are for determining a health of the processing equipment or industrial process including cause and effect logic. Other optional dynamic models shown include dynamic simulation models 273 to support simulation of the processing equipment or the industrial process to predict future performance or compare current (e.g., real-time) performance against simulation, and machine learning models 274 to detect changes in the processing equipment or performance of the industrial process based on data analysis. At least one of optional dynamic models 272-274 is generally needed to satisfy the conventional definition of a DT.

An example of a disclosed aggregated view that may be generated on a suitable display by a disclosed facility DT is an overview of a plant processing unit highlighting the actual vs. predicted process performance, status and predicted health of related processing equipment such as heat exchangers and pumps, metrics about production, and control and alarm performance. Disclosed facility DTs can also provide details about how well the sensors and other control equipment are working, how well processing equipment such as pumps are working, how well various process units are working (e.g., the overall crude processing unit), and how well the overall facility is working (or multiple facilities). See the example aggregated view in FIG. 3 described below.

A significant feature of disclosed facility DTs is use of a flowsheet model that relates the individual processing equipment (such as pumps and heat exchangers) to the performance parameters of overall industrial process. This enables improving the monitoring and predictions around the processing equipment by considering not only measurements directly about the processing equipment, but also the process conditions, material compositions, and environment that surround it. Likewise process performance monitoring which is conventionally done with the help of a dynamic process simulator can be enhanced with knowledge of equipment and controller performance that may be preventing the process from reaching its predicted performance. It is the ability to consider and relate multiple perspectives together that are conventionally independent of one another which is a distinguishing new feature for disclosed facility DTs.

Disclosed facility DTs provide a framework in which any aspect of plant and equipment operation and performance can be modeled, simulated and predicted. This supports a wide range of customer and third party solutions, sharing models and access to plant data as needed.

EXAMPLES

Disclosed embodiments are further illustrated by the following specific Examples, which should not be construed as limiting the scope or content of this Disclosure in any way.

Example core components for a disclosed facility DT include (Honeywell International Inc. current products in parenthesis) include a large scale data storage system for time-series and other data (commonly termed a data lake) and/or specialized storage (e.g., process historian such as PHD, cloud historian). An asset model 261 is for putting all data into a common context (COMMON ASSET MODEL). A calculation engine is for implementing the calculation model 271 for deriving status and values based on engineered rules (UNIFORMANCE SENTINEL). A rules engine is for detecting complex conditions and triggering follow-up action (UNIFORMANCE SENTINEL). A simulation engine is for implementing the dynamic simulation models 273 is for simulating process and equipment conditions generally based on first-principles modeling (UNISIM DESIGN). A machine learning module is for implementing the machine learning models 274 to provide the ability to output models for continuous monitoring, such as the Microsoft HDINSIGHT. Tools to visualize processes or equipment status and performance based on models (UNIFORMANCE INSIGHT, TABLEAU), and notification capability to provide alerts to users for certain situations of interest (Honeywell PULSE) are also included.

Figure 3:
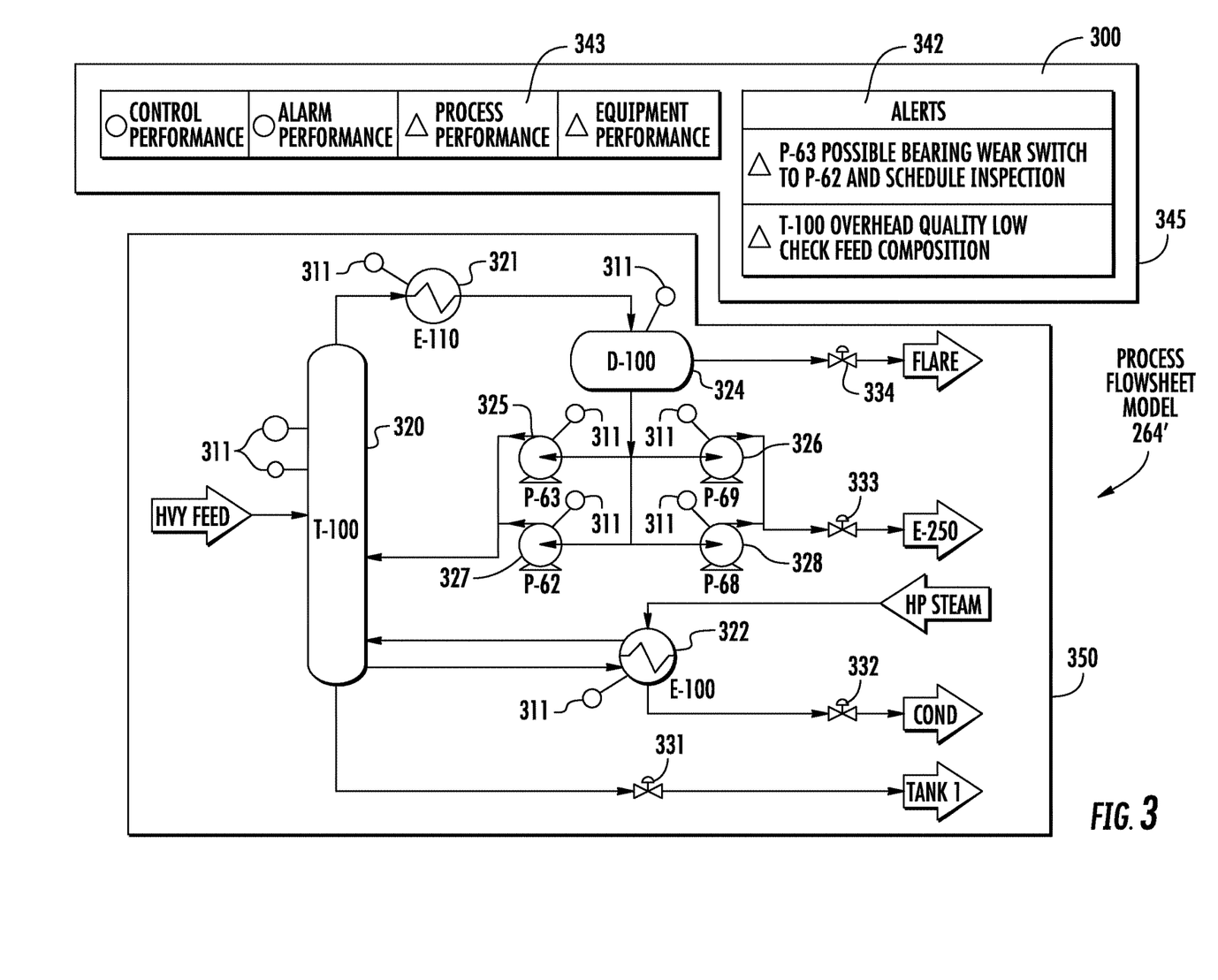
FIG. 3 shows an example aggregated view output generated by a disclosed facility DT in the top section which is generated by the facility DT about status and recommendations that includes current alerts and performance indicators generated from the process equipment and process performance monitoring, according to an example embodiment.

FIG. 3 shows an example aggregated view output 300 generated by a disclosed facility DT in the top section 345 including status and recommendations that include current alerts 342 and performance indicators 343 generated from the process equipment and process performance monitoring, according to an example embodiment. The example process flowsheet model shown as 264' in the below section 350 is one of the constituent models of the facility DT. The various models including the flowsheet model 264' linked to sensor measurements are used to determine status (e.g. the performance indicators 343) and predict possible events (e.g. the current alerts 342 shown on the top right).

In the process flowsheet model 264' at least one sensor shown as 311 is installed on each of the various processing equipment to obtain data to represent their near real-time status, working condition or position. Processing equipment shown includes distillation tower 320, heat exchangers 321, 322, a drum shown as D-100 324, compressors 325, 326, 327 and 328, and control valves 331, 332, 333, and 334. For simplicity, actuators that are coupled to the control valves are not shown.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

As will be appreciated by one skilled in the art, the subject matter disclosed herein may be embodied as a system, method or computer program product. Accordingly, this Disclosure can take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, this Disclosure may take the form of a computer program product embodied in any tangible medium of expression having computer usable program code embodied in the medium.

The invention claimed is:

1. A method of monitoring an industrial process in an industrial facility involving the manufacture of a product, comprising:
   providing an integrated facility digital twin (DT) implemented by a computer system including a processor and non-transitory memory running software stored in said memory which implements an aggregation algorithm that utilizes models including:
   (i) a plurality of inter-related static models for said an industrial facility comprising an asset model that describes devices and systems in said industrial facility including controllers, sensors and actuators coupled to processing equipment and a flowsheet model which is based on a process flow diagram defining how a tangible material flows between the processing equipment, the industrial facility configured to implement the industrial process that manufactures a tangible product;
   (ii) dynamic models of said industrial facility comprising calculation models to calculate at least one of a status of said processing equipment or said industrial process or to calculate an efficiency of said processing equipment or said industrial process, symptom and fault models to determine health of said processing equipment or health of said industrial process including cause and effect logic, dynamic simulation models to support simulation of said processing equipment or said industrial process to predict future performance or compare current performance against simulation, wherein the current performance is based on evaluating the measurement data, and machine learning models to detect changes in said processing equipment or performance of said industrial process based on data analysis, and
   said aggregation algorithm using as data sources outputs from said static models and said dynamic models, including from an output of the flowsheet model linked to receive the measurement data from the sensors, generating an aggregated view including current performance indicators and current alerts for at least one of said processing equipment and said industrial process based on said current performance of said industrial process.

2. The method of claim 1, further comprising using information in said aggregated view for at least one of data management or process management, device management, and analytics.

3. The method of claim 2, wherein said data or process management comprises determining at least one process control action from said aggregated view.

4. The method of claim 1, wherein said facility DT is Internet-of-things (IOT)-based.

5. The method of claim 1, wherein said static models further comprise a security model that describes roles and user' permissions relative to said industrial facility.

6. The method of claim 1, wherein said static models further comprise at least one selected from (i) a control model that describes control schemes implemented, (ii) a system model that describes said devices and said systems, and (iii) a spatial model that describes said devices and said systems or said industrial process in geographic or geometric terms.

7. The method of claim 1, wherein said facility DT models an enterprise comprising bei-Rg said systems and said devices at a plurality of geographically separated ones of said industrial facility.

8. A system for monitoring an industrial process in an industrial facility involving the manufacture of a product, comprising:
   an integrated facility digital twin (DT) implemented by a computer system including a processor and non-transitory memory running software stored in said memory which implements an aggregation algorithm that utilizes models including:
   (i) a plurality of inter-related static models for said an industrial facility comprising an asset model that describes devices and systems in an said industrial facility including controllers, sensors and actuators coupled to processing equipment and a flowsheet model which is based on a process flow diagram defining how a tangible material flows between the processing equipment, the industrial facility configured to implement the industrial process that manufactures a tangible product, and
   (ii) dynamic models of said industrial facility comprising calculation models to calculate at least one of a status of said processing equipment or said industrial process or to calculate an efficiency of said processing equipment or said industrial process, symptom and fault models to determine health of said processing equipment or health of said industrial process including cause and effect logic, dynamic simulation models to support simulation of said processing equipment or said industrial process to predict future performance or compare current performance against simulation, wherein the current performance is based on evaluating the measurement data, and machine learning models to detect changes in said processing equipment or performance of said industrial process based on data analysis, and
   said aggregation algorithm using as data sources outputs from said static models and said dynamic models, including from an output of the flowsheet model linked to receive the measurement data from the sensors, generating an aggregated view including current performance indicators and current alerts for at least one of said processing equipment and said industrial process based on said current performance of said industrial process.

9. The system of claim 8, wherein said static models further comprise a security model that describes roles and user' permissions relative to said industrial facility.

10. The system of claim 8, wherein said static models further comprise at least one selected from (i) a control model that describes control schemes implemented, (ii) a system model that describes said devices and said systems, and (iii) a spatial model that describes said devices and said systems or said industrial process in geographic or geometric terms.

11. The system of claim 8, wherein said facility DT models an enterprise comprising bei-Rg said systems and said devices at a plurality of geographically separated ones of said industrial facility.

12. A system for monitoring an industrial process, comprising:

an integrated facility digital twin (DT) implemented by a computer system including a processor and non-transitory memory running software stored in said memory which implements an aggregation algorithm that utilizes models including:

(i) a plurality of inter-related static models for an industrial facility comprising an asset model that describes devices and systems in said industrial facility including control devices, sensors and actuators coupled to processing equipment and a flowsheet model which is based on a process flow diagram defining how a tangible material flows between the processing equipment, the industrial facility configured to implement the industrial process that manufactures a tangible product; wherein the DT is coupled to receive measurement data including real-time data from the processing equipment, from the sensors, and from the control devices;

(ii) dynamic models of said industrial facility comprising calculation models to calculate at least one of a status of said processing equipment or said industrial process or to calculate an efficiency of said processing equipment or said industrial process, symptom and fault models to determine health of said processing equipment or health of said industrial process including cause and effect logic, dynamic simulation models to support simulation of said processing equipment or said industrial process to predict future performance or compare current performance against simulation, and machine learning models to detect changes in said processing equipment or performance of said industrial process based on data analysis, and said aggregation algorithm using outputs from said static models and said dynamic models, including from an output of the flowsheet model linked to receive the measurement data from the sensors, generating an aggregated view including performance alerts for at least one of said processing equipment and said industrial process based on said current performance of said industrial process.

* * * * *